US012581784B2

(12) United States Patent
Deng et al.

(10) Patent No.: US 12,581,784 B2
(45) Date of Patent: Mar. 17, 2026

(54) LIGHT-EMITTING BOARD AND PREPARATION METHOD THEREOF

(71) Applicant: TCL China Star Optoelectronics Technology Co., Ltd., Shenzhen (CN)

(72) Inventors: Hongzhao Deng, Shenzhen (CN); Jing Liu, Shenzhen (CN); Hao Chen, Shenzhen (CN); Linnan Chen, Shenzhen (CN)

(73) Assignee: TCL CHINA STAR OPTOELECTRONICS TECHNOLOGY CO., LTD., Shenzhen (CN)

( * ) Notice: Subject to any disclaimer, the term of this patent is extended or adjusted under 35 U.S.C. 154(b) by 539 days.

(21) Appl. No.: 18/067,992

(22) Filed: Dec. 19, 2022

(65) Prior Publication Data

US 2024/0154071 A1 May 9, 2024

(30) Foreign Application Priority Data

Nov. 7, 2022 (CN) .......................... 202211386748.0

(51) Int. Cl.
*H10H 29/01* (2025.01)
*H01L 25/16* (2023.01)
(Continued)

(52) U.S. Cl.
CPC ....... *H10H 29/0363* (2025.01); *H01L 25/167* (2013.01); *H10H 20/841* (2025.01); *H10H 29/01* (2025.01); *H10H 20/034* (2025.01)

(58) Field of Classification Search
None
See application file for complete search history.

(56) References Cited

U.S. PATENT DOCUMENTS 9,891,470 B2 2/2018 Lu et al.
2006/0270987 A1* 11/2006 Peter ................. A61M 5/14244
604/151

(Continued)

FOREIGN PATENT DOCUMENTS

CN 212623484 U 2/2021
JP H08262209 A 10/1996

OTHER PUBLICATIONS

Chinese Office Action issued in corresponding Chinese Patent Application No. 202211386748.0 dated Dec. 1, 2023, pp. 1-7.

*Primary Examiner* — Feifei Yeung Lopez
(74) *Attorney, Agent, or Firm* — PV IP PC; Wei Te Chung

(57) ABSTRACT

Provided is a light-emitting panel comprising a substrate, a plurality of light-emitting device, and a reflection sheet, wherein the plurality of light-emitting devices and the reflection sheet are disposed on the same side of the substrate, the reflection sheet comprises a plurality of first through-holes, which are in one-to-one correspondence with the plurality of light-emitting devices, and the reflection sheet at an edge of the plurality of first through-holes is configured to wrap around an edge of the plurality of light-emitting device, and a gap between an edge of the plurality of first through-holes and an edge adjacent to the plurality of light-emitting devices is less than 0.1 mm, so that a distance between the edge of the plurality of first through holes and the edge of the plurality of light-emitting devices is reduced, and the size and width of the windowed area are reduced.

11 Claims, 5 Drawing Sheets

(51) Int. Cl.
    *H10H 20/841*      (2025.01)
    *H10H 20/01*       (2025.01)

(56)           References Cited

U.S. PATENT DOCUMENTS

| | | | | |
|---|---|---|---|---|
| 2007/0200512 A1* | 8/2007 | Gotou | ................... | H05B 45/40 |
| | | | | 257/E25.032 |
| 2010/0200146 A1* | 8/2010 | Zhu | ................... | B29C 37/0064 |
| | | | | 427/133 |
| 2013/0020600 A1* | 1/2013 | Yoo | ................... | H10H 20/854 |
| | | | | 257/E33.072 |
| 2015/0054422 A1* | 2/2015 | Koo | ................... | H05B 47/19 |
| | | | | 315/250 |
| 2016/0091759 A1* | 3/2016 | Lu | ................... | G02F 1/133605 |
| | | | | 362/97.3 |
| 2016/0245697 A1* | 8/2016 | Shibayama | ............... | G01J 3/26 |
| 2022/0102589 A1* | 3/2022 | Kim | ................... | H01L 25/167 |
| 2024/0332469 A1* | 10/2024 | Wang | ................... | G02F 1/1336 |

* cited by examiner

Providing a substrate ⟶ S10

Preparing a plurality of light-emitting device on one side of the substrate ⟶ S20

Providing a reflection sheet which is attached to the same side of the substrate on which the plurality of light-emitting device are disposed, wherein the reflection sheet comprises a plurality of second through-hole disposed in one-to-one correspondence with the plurality of light-emitting devices, and sizes of the plurality of second through-hole are larger than those of the plurality of light-emitting devices ⟶ S30

Heating the reflection sheet to a preset temperature so that the reflection sheet expands, wherein the plurality of second through-holes shrink with expansion of the reflection sheet to form a plurality of first through-holes, an edge of the plurality of first through-holes is configured to wrap around an edge of the plurality of light-emitting devices, and a gap between an edge of the plurality of first through-holes and an edge adjacent to the plurality of light-emitting devices is less than 0.1 mm ⟶ S40

FIG. 6

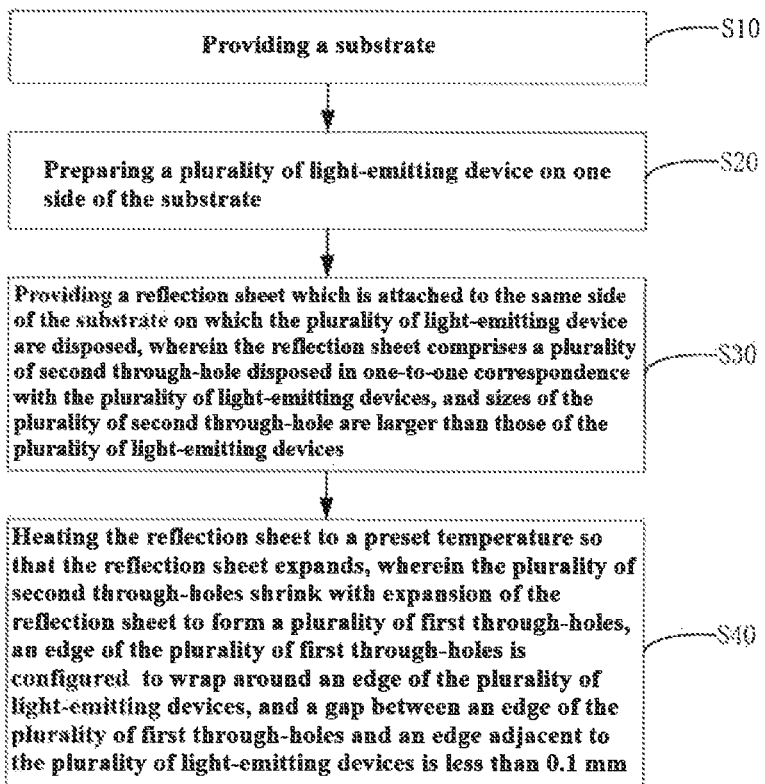

LIGHT-EMITTING BOARD AND PREPARATION METHOD THEREOF

CROSS-REFERENCE TO RELATED APPLICATION

The present disclosure claims priority to and the benefit of Chinese Patent Application No. 202211386748.0, filed on Nov. 7, 2022, the entire content of which is hereby incorporated by reference.

TECHNICAL FIELD

The present disclosure relates to a technical field of display, and in particular, to a light-emitting panel and a preparation method thereof.

BACKGROUND

In order to make light of a light-emitting panel more uniform throughout the panel, reflectivity is generally increased by attaching a reflection sheet. However, at present, in order to improve attaching yield of the reflection sheet, a second through-hole corresponding to a light-emitting device is set to a larger size, so that after the reflection sheet is attached, there is a windowed area not covered by the reflection sheet at edges of the light-emitting device. In the windowed area, reflection is mainly provided by a bottom reflective layer. When a difference in reflectivity between the bottom reflective layer and the reflection sheet is more than 5%, optical quality will be affected, that is, there is a technical problem of uniform light efficiency at edges of the light-emitting device.

There are two main factors that affect reflectivity of the windowed area. Firstly, reflectivity of the bottom reflective layer and reflectivity of the reflection sheet are inconsistent since no reflection sheet is provided in the windowed area, in which the bottom reflective layer has a maximum reflectivity of 93% while the reflection sheet has a reflectivity of greater than 98%. Secondly, assuming that the bottom reflective layer has the same reflectivity as that of the reflection sheet, reflectivity of the bottom reflective layer and reflectivity of the reflection sheet are still inconsistent because they have different heights and are made of different materials, which will negatively affect the optical quality and result in non-uniform light efficiency.

Therefore, the existing light-emitting panel has a technical problem of non-uniform light efficiency at edges of the light-emitting device.

SUMMARY

The present disclosure provides a light-emitting panel and a preparation method thereof, which can alleviate the technical problem of non-uniform light efficiency at edges of the light-emitting device in the existing light-emitting panel.

An embodiment of the present disclosure provides a light-emitting panel, comprising:

a substrate;

a plurality of light-emitting devices and a reflection sheet, and the plurality of light-emitting devices and the reflection sheet are disposed on the same side of the substrate;

wherein the reflection sheet comprises a plurality of first through-holes, which are in one-to-one correspondence with the plurality of light-emitting devices, and the reflection sheet at an edge of the plurality of first through-holes is configured to wrap around an edge of the plurality of light-emitting devices, and a gap between an edge of the plurality of first through-holes and an edge adjacent to the plurality of light-emitting devices is less than 0.1 mm.

Optionally, in some embodiments of the present disclosure, the reflection sheet comprises a thermally-expandable substrate and a reflective coating disposed on one side of the thermally-expandable substrate, the plurality of first through-holes penetrate through the thermally-expandable substrate and the reflective coating, and a material for preparing the thermally-expandable substrate has a coefficient of thermal expansion of greater than or equal to 60 ppm/° C.

Optionally, in some embodiments of the present disclosure, the material for preparing the thermally-expandable substrate comprises at least one of a polyoxymethylene resin and polydimethylsiloxane.

Optionally, in some embodiments of the present disclosure, an absolute value of a difference of thermal expansion coefficients between the reflective coating and the thermally-expandable substrate is less than or equal to 50 ppm/° C.

Optionally, in some embodiments of the present disclosure, shapes of the plurality of first through-holes are the same as those of the plurality of light-emitting devices, and sizes of the plurality of first through-holes are larger than or equal to those of the plurality of light-emitting devices.

An embodiment of the present disclosure further provides a method for preparing a light-emitting panel, comprising steps of:

providing a substrate;

preparing a plurality of light-emitting devices on one side of the substrate;

providing a reflection sheet which is attached to the same side of the substrate where the light-emitting device is disposed, wherein the reflection sheet comprises a plurality of second through-holes disposed in one-to-one correspondence with the plurality of light-emitting devices, and sizes of the plurality of second through-holes are larger than those of the plurality of light-emitting devices; and heating the reflection sheet to a preset temperature so that the reflection sheet expands, wherein the plurality of second through-holes shrink with expansion of the reflection sheet to form a plurality of first through-holes, an edge of the first through-hole is configured to wrap around an edge of the light-emitting device, and a gap between an edge of the first through-hole and an edge adjacent to the light-emitting device is less than 0.1 mm.

Optionally, in some embodiments of the present disclosure, in the step of attaching the reflection sheet to one side of the substrate facing the light-emitting device, a distance between an edge of the second through-hole and an edge adjacent to the light-emitting device ranges from 0.1 mm to 0.2 mm.

Optionally, in some embodiments of the present disclosure, the preset temperature is greater than 350° C. and less than 550° C.

Optionally, in some embodiments of the present disclosure, the step of providing the reflection sheet further comprises forming a reflective coating of the reflection sheet by magnetron sputtering.

Optionally, in some embodiments of the present disclosure, the step of attaching the reflection sheet to one side of the substrate facing the light-emitting device further comprises attaching the reflection sheet to one side of the light-emitting device away from the substrate with an adhesive having a viscosity of 6000 mPa S or more.

The present disclosure has the following beneficial effects: by wrapping around the light-emitting device with the reflection sheet at edges of the first through-hole, the gap between an edge of the first through-hole and an edge adjacent to the light-emitting device is less than 0.1 mm, so that a distance between the edge of the first through hole and the edge of the light-emitting device is reduced, and the size and width of the windowed area are reduced, thereby alleviating the technical problem of non-uniform light efficiency at edges of the light-emitting device in the existing light-emitting panel.

BRIEF DESCRIPTION OF THE DRAWINGS

In order to more clearly describe the technical solutions in embodiments of the present disclosure, hereinafter, the appended drawings used for describing the embodiments will be briefly introduced. Apparently, the appended drawings described below are only directed to some embodiments of the present disclosure, and for a person skilled in the art, without expenditure of creative labor, other drawings can be derived on the basis of these appended drawings.

FIG. 6 is a schematic flow chart of a light-emitting panel according to the present disclosure;

FIG. 7 is a schematic cross-sectional view of a reflection sheet according to the present disclosure;

FIG. 8 is a flow chart of preparation steps of a reflection sheet according to the present disclosure;

DESCRIPTION OF REFERENCE NUMBERS

Figure 1:
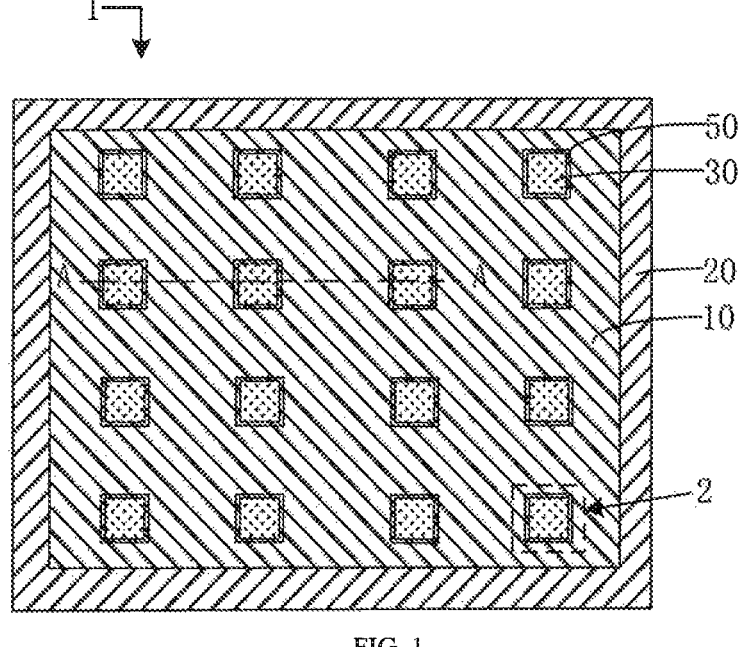
FIG. 1 is a top schematic view of a light-emitting panel according to the present disclosure.

| Reference number | Name of components | Reference number | Name of components |
|---|---|---|---|
| 1 | Light-emitting panel | 2 | First specific area |
| 10 | Reflection sheet | 20 | Substrate |
| 30 | Light-emitting device | 40 | Second through-hole |
| 50 | First through-hole | S | Windowed area |
| 60 | Release film | 101 | Thermally-expandable substrate |
| 102 | Reflective coating | 70 | Driving device |
| 3 | Second specific area | | |

DETAILED DESCRIPTION

Hereinafter, technical solutions in embodiments of the present disclosure will be clearly and completely described with reference to the accompanying drawings in embodiments of the present disclosure. Apparently, the described embodiments are part of, but not all of, the embodiments of the present disclosure. All the other embodiments, obtained by a person with ordinary skill in the art on the basis of the embodiments in the present disclosure without expenditure of creative labor, belong to the protection scope of the present disclosure. In addition, it should be understood that specific embodiments described herein are only used to illustrate and explain the present disclosure, and are not intended to limit the present disclosure. In the present disclosure, unless otherwise stated, in the description of the present disclosure, the terms "up" and "down" generally refer to the up and down of the device in actual use or working state, specifically the direction of the drawing in the accompanying drawings; while the terms "inside" and "outside" refer to the outline of the device.

Figure 2:
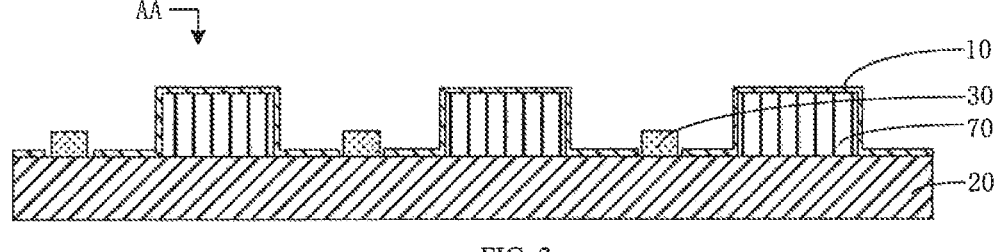
FIG. 2 is a schematic cross-sectional view taken along position A-A of a light-emitting panel according to the present disclosure.
Figure 3:
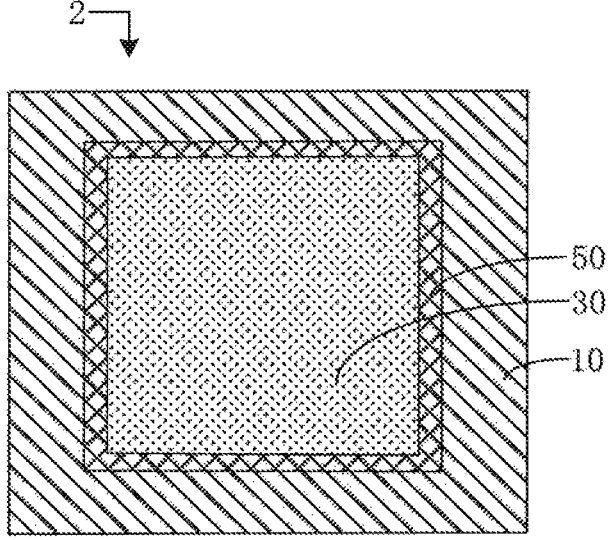
FIG. 3 is an enlarged schematic view of a first specific area 2 of the light-emitting panel provided in FIG. 1 of the present disclosure.

With respect to FIG. 1, FIG. 2, and FIG. 3, a light-emitting panel 1 provided in an embodiment of the present disclosure comprises a substrate 20, a plurality of light-emitting devices 30, and a reflection sheet 10, wherein the plurality of light-emitting devices 30 and the reflection sheet 10 are disposed on the same side of the substrate 20. The reflection sheet 10 comprises a first plurality of through-holes 50, which are in one-to-one correspondence with the plurality of light-emitting devices 30, and the reflection sheet 10 at an edge of the first through-hole 50 is configured to wrap around an edge of the light-emitting device 30, and a gap between an edge of the first through-hole 50 and an edge adjacent to the light-emitting device 30 is less than 0.1 mm.

FIG. 3 is an enlarged schematic view of a first specific area 2 of the light-emitting panel provided in FIG. 1 of the present disclosure.

Edges of the first through-holes 50 surround inner walls of the first through-holes 50, edges of the light-emitting devices 30 surround outer circumferences of the light-emitting devices 30, a gap between an edge of the first through-hole 50 and an edge adjacent to the light-emitting device 30 refers to a distance between two adjacent edges, and one of the adjacent two edges refers to an edge of the first through-hole 50, and the other of the adjacent two edges refers to an edge of the light-emitting device 30.

In some embodiments, a longitudinal cross-sectional view of the light-emitting panel is shown in FIG. 2. The light-emitting panel further comprises a driving device 70, the light-emitting devices and the reflection sheet are disposed on the same side of the substrate, and the driving device 70 is disposed on the same side of the substrate 20 as the light-emitting device 30.

In this embodiment, edges of the first through-holes 50 are attached to edges of the light-emitting devices 30, so that a distance between an edge of the first through-hole 50 and an edge of the light-emitting device 30 is reduced, and the size and width of the windowed area S are reduced, thereby alleviating the technical problem of non-uniform light efficiency at edges of the light-emitting device 30.

Technical solutions of the present disclosure will now be described with reference to specific embodiments.

Embodiments of the present disclosure are only described by taking an application of the reflection sheet 10 in a backlight module of a liquid crystal display panel as an example. In other applications where the reflection sheet 10 is used and the light efficiency of the windowed area S at edges of the light-emitting devices 30 is non-uniform, such as OLED display panel and MLED display panel, inventive concept of the present disclosure is also applicable, and the reflection sheet 10 can be applied in the application, thereby alleviating the technical problem of non-uniform light efficiency at edges of the light-emitting device 30.

In addition, exemplified temperatures, sizes, processing processes, and materials, etc. of the present disclosure are described in the best or preferred embodiments only. For a solution in which the coefficient of thermal expansion is increased to achieve improvement in light uniformity, other preferred or inferior solutions should fall within the scope of the present disclosure, and details will not be repeated here.

In an embodiment, the reflection sheet comprises a thermally-expandable substrate and a reflective coating disposed on one side of the thermally-expandable substrate, the first through-holes penetrate through the thermally-expandable substrate and the reflective coating, and a material for preparing the thermally-expandable substrate has a coefficient of thermal expansion of greater than or equal to 60 ppm/° C.

In an embodiment, the material for preparing the thermally-expandable substrate comprises at least one of a polyoxymethylene resin and polydimethylsiloxane.

Both the coefficient of thermal expansion of the polyoxymethylene resin and the coefficient of thermal expansion of the polydimethylsiloxane are higher than that of a PET material.

The polyoxymethylene resin has a coefficient of thermal expansion of 550 ppm/° C., that is, the polyoxymethylene resin expands by 0.055% each time the temperature is raised by 1° C.

The polydimethylsiloxane has a coefficient of thermal expansion of 340 ppm/° C., that is, the polydimethylsiloxane expands by 0.034% each time the temperature is raised by 1° C.

Further, the above materials can maintain good flatness when thermally expanded, thus improving uniformity of reflected lights of the reflection sheet 10.

It can be understood that a material of the thermally-expandable substrate currently available in mass is PET plastic, which has a coefficient of thermal expansion of 60 ppm/° C., i.e., the PET plastic expands by 0.006% each time the temperature is raised by 1° C. A low coefficient of thermal expansion easily leads to a large distance between edges of the reflection sheet 10 and edges of the light-emitting devices 30, resulting in problem of non-uniform light efficiency.

In this embodiment, the thermally-expandable substrate 101 is made of a material having a larger coefficient of thermal expansion than that of the PET plastic, so as to improve expansion degree of the reflection sheet 10 at the same temperature, thereby further reducing the distance between each of the plurality of light-emitting device 30 and the reflection sheet 10, and alleviating the phenomenon of non-uniform light efficiency at edges of the light-emitting device 30.

In an embodiment, a material for preparing the reflective coating 102 comprises at least an organic expandable material.

The material used for preparing the reflective coating 102 further comprises titanium dioxide, which functions as a highly reflective material to reflect lights.

It can be understood that the reflective coating 102 can have a certain degree of thermal expansion by containing an organic expandable material. When the thermally-expandable substrate 101 expands, the reflective coating 102 also expands to a certain extent, thereby reducing a relative displacement between the thermally-expandable substrate 101 and the reflective coating 102 due to the expansion, thus reducing a risk of the reflective coating 102 falling off the thermally-expandable substrate 101 upon thermally expanded.

In this embodiment, the reflective coating 102 is doped with an organic expandable material, so that the reflective coating 102 expands in the same direction as the thermally-expandable substrate 101 when heated, thus avoiding the phenomenon of film displacement and separation between the reflective coating 102 and the thermally-expandable substrate 101.

In an embodiment, the shape of the first through-hole 50 is the same as that of the light-emitting device 30, and the size of the first through-hole 50 is larger than or equal to that of the light-emitting device 30.

When the size of the first through-hole 50 is equal to that of the light-emitting device 30, the reflection sheet 10 at an edge of the first through-hole 50 is configured to wrap around the edge of the light-emitting device 30.

The shape of the first through-hole 50 is the same as that of the light-emitting device 30.

In this embodiment, when the size of the first through-hole 50 is equal to that of the light-emitting device 30, the gap between the edge of the first through-hole 50 and the edge of the light-emitting device 30 is 0, and the width of the windowed area S in either direction is also 0, so that non-uniform light efficiency at edges of the light-emitting device 30 can be minimized.

In an embodiment, the type of the substrate 20 is not limited to glass, printed circuit boards, and flexible circuit boards.

In an embodiment, the spacing between adjacent light emitting devices 30 may be equal, so as to further improve uniformity of the light emitting.

In an embodiment, the type, number, and size of the driving device 70 and the light-emitting device 30 are not limited.

The light-emitting device 30 may be an LED lamp, or other light-emitting elements.

The driving device 70 may be a driving chip, a resistor, or the like.

The length and width of the light-emitting device 30 may be 300 microns by 300 microns, and the length and width of the light emitting-device 30 may also be 1000 microns by 500 microns.

In one embodiment, the driving mode is not limited, and may be AM TFT driving, AM Micro IC driving, or PM driving.

In one embodiment, there is no limit to the way of digging the second through-hole 40 in the reflection sheet 10.

Wherein, the way of digging may be a mechanical digging, a laser digging, or the like.

It can be understood that the mechanical digging produces less heat than the laser digging, which advantageously reduces deformation of the reflection sheet 10 itself and improves the yield.

In an embodiment, the reflection sheet 10 may be attached in an unlimited manner, either manually or mechanically.

In an embodiment, the substrate 20 is provided with at least one vacuum hole penetrating through the substrate 20, and the vacuum hole is disposed to avoid the light-emitting device 30 and the driving device 70 in the film thickness direction.

The vacuum hole is used to cooperate with a vacuumizing process, so that residual gas on the side of the reflection sheet 10 adjacent to the substrate 20 is extracted from the vacuum hole, and a negative pressure is formed on the side of the reflection sheet 10 adjacent to the substrate 20. The negative pressure makes the reflection sheet 10 attach more tightly to the driving device 70, so that the surface of the reflection sheet 10 is more flat, thus improving uniformity of reflected lights of the reflection sheet 10.

The method of vacuumizing the vacuum hole in the substrate 20 is not limited.

In the present embodiment, the substrate 20 is provided with at least one vacuum hole, and a negative pressure is formed at the vacuum hole by vacuumizing, so that the reflection sheet 10 can better attach to the driving device 70, and flatness of the surface of the reflection sheet 10 is improved, thereby improving uniformity of reflected lights of the reflection sheet 10.

With respect to FIGS. 4A to 4D and FIG. 6, a method for preparing a light-emitting panel 1 provided by embodiments of the present disclosure comprises steps of:

S10: providing a substrate 20;

S20, preparing a plurality of light-emitting devices 30 on one side of the substrate 20;

S30, providing a reflection sheet 10 according to any one of the above embodiments, wherein, the reflection sheet 10 is attached to the same side of the substrate 20 on which the plurality of light-emitting devices 30 are disposed, sizes of the second through-holes 40 are larger than those of the light-emitting devices 30, and the second through-holes 40 are disposed in one-to-one correspondence with the light-emitting devices 30;

S40, heating the reflection sheet 10 to a preset temperature so that the reflection sheet 10 expands, wherein the second through-holes 40 shrink with expansion of the reflection sheet 10 to form a plurality of first through-holes 50, an edge of the first through-hole 50 is configured to wrap around an edge of the light-emitting devices 30, and a gap between an edge of the first through-holes 50 and an edge adjacent to the light-emitting devices 30 is less than 0.1 mm.

Figure 4A:
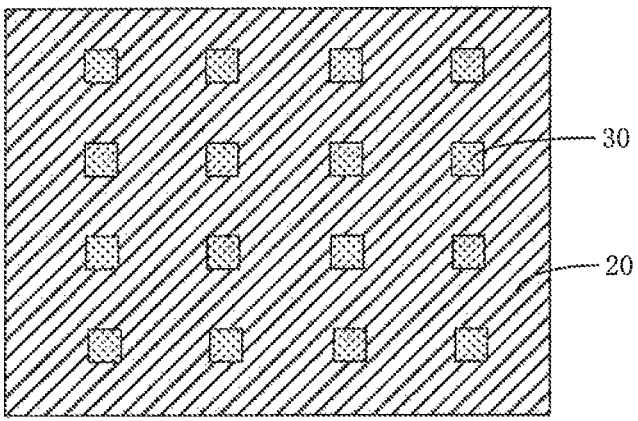
FIGS. 4A to 4D are flow charts of preparation steps of a light-emitting panel according to the present disclosure.

With respect to FIG. 4A, a substrate 20 disposed with a light-emitting device 30 is provided.

Figure 4B:
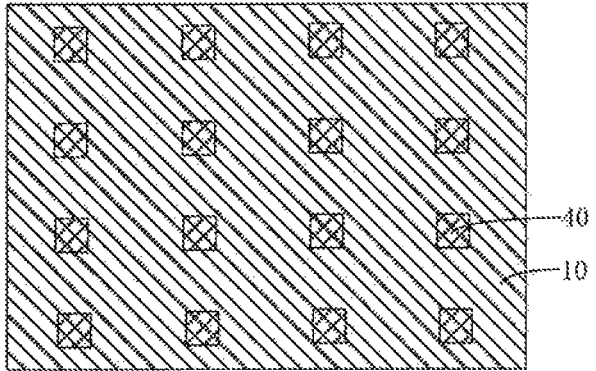

With respect to FIG. 4B, a reflection sheet 10 having a second through-hole 40 is provided.

Figure 4C:
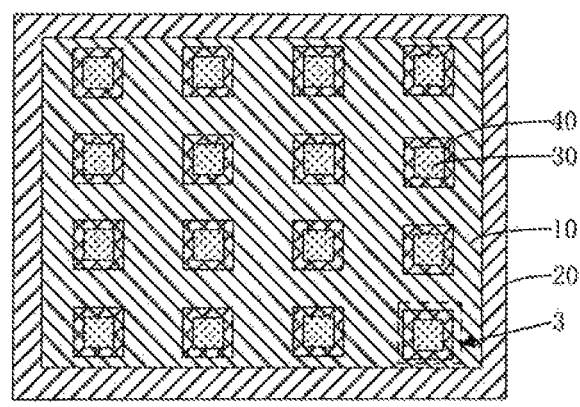

With respect to FIG. 4C, the reflection sheet 10 is attached to one side of the substrate 20 where the light-emitting devices 30 are disposed, and the second through-holes 40 are disposed in one-to-one correspondence with the light-emitting devices 30.

Figure 4D:
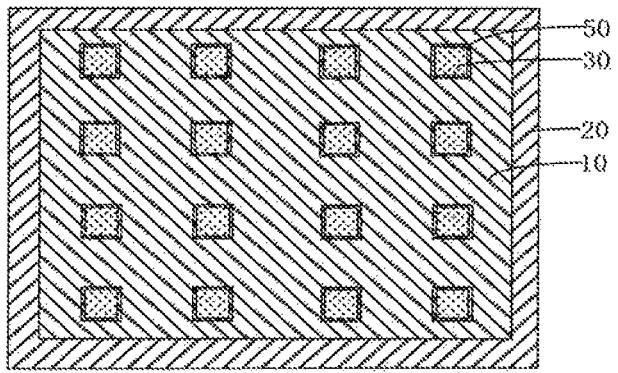

With respect to FIG. 4D, by heating the reflection sheet 10, the reflection sheet 10 is expanded, and the second through-holes 40 are shrinked into the first through-holes 50, so that an inner diameter of the first through-hole 50 is smaller than that of the second through-hole 40, and the reflection sheet 10 at edges of the first through-holes 50 can wrap around edges of the light-emitting devices 30.

After step S40 is completed, the reflection sheet 10 may be shaped by natural cooling. It can be understood that when the thermally-expandable substrate 101 prepared from the polyoxymethylene resin and the polydimethylsiloxane is thermally expanded, molecular chains will be partially elongated and become linear. This process is an irreversible process. Therefore, when the thermally-expandable substrate 101 won't shrink back to cause the width of the windowed area S to become larger when it is cooled.

In an embodiment, in the step of attaching the reflection sheet to one side of the substrate facing the light-emitting devices, a distance between an edge of the second through-hole and an edge adjacent to the light-emitting device ranges from 0.1 mm to 0.2 mm.

The second through-holes 40 are disposed in one-to-one correspondence with the light-emitting devices 30 when attaching the reflection sheet 10.

When the distance between edges of the second through-hole 40 and edges of the light-emitting device 30 is larger, difficulty of attaching the reflection sheet 10 is smaller, and accuracy of attaching the reflection sheet 10 is worse. When the distance between edges of the second through-hole 40 and edges of the light-emitting device 30 is smaller, difficulty of attaching the reflection sheet 10 is larger, and accuracy of attaching the reflection sheet 10 is better. Therefore, difficulty and accuracy of attaching the reflection sheet are mutually limited and contradictory.

It can be understood that in order to achieve a certain attaching yield of the reflection sheet, the distance between edges of the second through-hole 40 and edges of the light-emitting device 30 needs to be not less than 0.1 mm. When the distance between edges of the second through-hole 40 and edges of the light-emitting device 30 is 0.1 mm, it is the minimum distance required to meet the attaching yield of the reflection sheet 10.

It can be understood that when the distance between edges of the second through-hole 40 and edges of the light-emitting device 30 is 0.2 mm, and when the coefficient of thermal expansion of the thermally-expandable substrate 101 is equal to 340 ppm/° C., the reflection sheet 10 is thermally expanded at 350° C., so that the distance between edges of the first through-hole 50 and edges of the light-emitting device 30 is 0.05 mm, that is, edges of the reflection sheet 10 can wrap around edges of the light-emitting device.

It should be noted that the distance between edges of the second through-hole 40 and edges of the light-emitting device 30 is larger than 0.2 mm, edges of the reflection sheet 10 can also wrap around edges of the reflection sheet 10 by increasing the coefficient of thermal expansion of the thermal expansion substrate 101 to be greater than 340 ppm/° C.

In this embodiment, it is illustrated only by taking the coefficient of thermal expansion of the thermally-expandable substrate 101 being equal to 340 ppm/° C. as an example, and the material of the thermally-expandable substrate 101 may be polydimethylsiloxane, thereby solving the problem that the difficulty and accuracy of attaching the reflection sheet are mutually limited and contradictory.

In an embodiment, the preset temperature is greater than 350° C. and less than 550° C.

The preset temperature may be 400° C., 450° C., or 500° C. Since the preset temperature is less than 550° C., the light-emitting device 30 will not suffer from a failure or the like at this temperature. Meanwhile, the preset temperature at this time is also greater than 350° C., which can also meet the requirement that the reflection sheet 10 at edges of the first through-hole 50 wraps around edges of the light-emitting device 30 when the reflection sheet 10 expands.

The preset temperature is less than 550° C., which can avoid failure of the light-emitting device and other devices on the substrate due to excessively high temperature.

In an embodiment, the step of providing the reflection sheet 10 further comprises preparing a reflective coating 102 of the reflection sheet 10 by magnetron sputtering.

It can be understood that connection strength of the reflective coating 102 and the thermally-expandable substrate 101 can be improved by magnetron sputtering, so that they can firmly bonded. Therefore, the reflective coating 102 will expand with the expansion of the thermally-expandable substrate 101.

Further, the reflective coating 102 can also be prepared from a reflective material having a coefficient of thermal expansion of greater than 60 ppm/° C.

The reflective coating 102 may have a coefficient of thermal expansion the same as or similar to that of the thermally-expandable substrate 101, and similar coefficient of thermal expansion means that an absolute value of a difference between coefficient of thermal expansion of the reflective coating 102 and coefficient of thermal expansion of the thermally-expandable substrate 101 is less than or equal to 50 ppm/° C.

In an embodiment, the step of attaching the reflection sheet 10 to one side of the substrate 20 facing the light-emitting device 30 further comprises attaching the reflection sheet 10 to a side of the light-emitting device 30 away from the substrate 20 with an adhesive having a viscosity of 6000 mPa·S or more.

In this embodiment, the reflection sheet 10 and the light-emitting device 30 are fixed by using a high-strength adhesive, which ensure that there will be no relative displacements among the reflective coating 102, the thermally-expandable substrate 101, the reflection sheet 10, and the light-emitting device 30 when the reflection sheet 10 expands, thereby reducing the risk that the reflective coating 102 falls off and the risk that the reflection sheet 10 moves.

In an embodiment, at least one vacuum hole penetrating through the substrate 20 is formed in the substrate 20 by means of mechanical cutting to avoid the light-emitting device 30 and the driving device 70 in the film thickness direction.

In the present disclosure, the coefficient of thermal expansion of the thermally-expandable substrate 101 of the reflection sheet 10 is set to be greater than 60 ppm/° C., so that a larger second through-hole 40 can be provided when attaching the reflection sheet 10, thus reducing the difficulty of attaching, and improving the attaching yield. After attaching of the reflection sheet 10 is completed, the reflection sheet 10 is thermally expanded by heating the reflection sheet 10. Since the coefficient of thermal expansion of the thermally-expandable substrate 101 is greater than 60 ppm/° C., edges of the reflection sheet 10 can wrap around edges of the light-emitting device 30, so that width of the windowed area S around the light-emitting device 30 is reduced or is 0, thereby greatly alleviating the technical problem of non-uniform light efficiency at edges of the light-emitting device 30 in the existing light-emitting panel 1.

Figure 5:
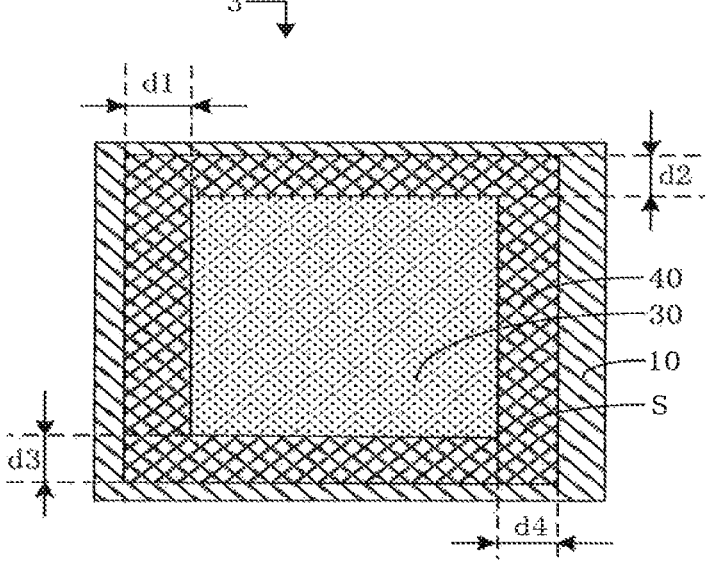
FIG. 5 is an enlarged schematic diagram of a second specific area 3 of the light-emitting panel provided in FIG. 4C of the present disclosure.

It should be noted that, with respect to FIG. 5, the windowed area S comprises spacings d1, d2, d3, and d4, wherein spacing d1 is a vertical distance between a first side edge of the light-emitting device 30 and a first side edge of the second through-hole 40, spacing d2 is a vertical distance between a second side edge of the light-emitting device 30 and a second side edge of the second through-hole 40, spacing d3 is a vertical distance between a third side edge of the light-emitting device 30 and a third side edge of the second through-hole 40, and spacing d4 is a vertical distance between a fourth side edge of the light-emitting device 30 and a fourth side edge of the second through-hole 40.

FIG. 5 is an enlarged schematic diagram of the second specific area 3 in FIG. 4C, and the windowed area S is specifically indicated in FIG. 5. Specifically, the windowed area S is an area between an edge of the second through-hole 40 and an edge of the light-emitting device 30. It should be noted that the edge of the second through-hole 40 is the hole wall of the second through-hole 40.

Wherein the edge of the second through-hole 40 encircles the inner wall of the second through-hole 40, the edge of the light-emitting device 30 encircles the outer circumference of the light-emitting device 30, the spacings d1, d2, d3, d4 between edges of the second through-hole 40 and edges of the adjacent light-emitting device 30 refers to the distance between two adjacent edges, and one of the adjacent two edges refers to an edge of the second through-hole 40, and the other of the adjacent two edges refers to an edge of the light-emitting device 30.

When at least two of d1, d2, d3, and d4 are not equal, the minimum value dm of d1, d2, d3, and d4 is taken, so that the expansion amount of the reflection sheet 10 is smaller than dm, thereby preventing the reflection sheet 10 from over-expanding and squeezing the light-emitting device 30, resulting in displacement or falling off of the light-emitting device 30.

Further, dm=the expansion amount of the reflection sheet 10+0.05 mm.

It can be understood that when the average value of d1, d2, d3, and d4 is 0.2 mm, since there is an error of ±0.05 mm in the accuracy of attaching, it is illustrated only by taking at least one of d1, d2, d3, and d4 is 0.15 mm and the other is 0.25 mm as an example. In this case, dm=0.15 mm, and the expansion amount of the reflection sheet 10=dm−0.05 mm=0.1 mm; together by controlling factors such as the temperature, the coefficient of thermal expansion of the thermally-expandable substrate, and the like, the expansion amount of the reflection sheet 10 is controlled as 0.1 mm, thus preventing the reflection sheet 10 from squeezing the light-emitting device 30.

It can be understood that by reserving the spacing between an edge of the first through-hole 50 and an edge of the light-emitting device 30 to be 0.05 mm, so that edges of the reflection sheet 10 can wrap around edges of the light-emitting device 30, and the reflection sheet 10 will not squeeze the light-emitting device 30, thereby further preventing displacement or falling off of the light-emitting device 30 due to squeezing of the reflection sheet 10.

In addition, with respect to FIG. 7, the present disclosure further provides a reflection sheet 10 comprising a thermally-expandable substrate 101 and a reflective coating layer 102 disposed on one side of the thermally-expandable substrate 101, wherein the reflection sheet 10 is provided with at least one second through-hole 40 penetrating through the thermally-expandable substrate 101 and the reflective coating layer 102, and a material for preparing the thermally-expandable substrate 101 has a coefficient of thermal expansion of greater than 60 ppm/° C.

Further, the material for preparing the thermally-expandable substrate 101 has a coefficient of thermal expansion of greater than or equal to 340 ppm/° C., and edges of the reflection sheet 10 can wrap around edges of the light-emitting device 30 by heating the reflection sheet 10.

The reflective coating 102 is used to reflect light.

It can be understood that the thermally-expandable substrate 101 will expand when heated, and that the expansion of the reflection sheet 10 will reduce size of the second through-hole 40.

In this embodiment, by using the reflection sheet 10 having a coefficient of thermal expansion of greater than 60 ppm/° C., the reflection sheet 10 is expanded by heating after attaching the thermally-expandable substrate 101, so that the distance between edges of the reflection sheet 10 and edges of the light-emitting device 30 is reduced, thereby alleviating the technical problem of non-uniform light efficiency at edges of the light-emitting device 30 in the existing light-emitting panel 1.

Figure 9:
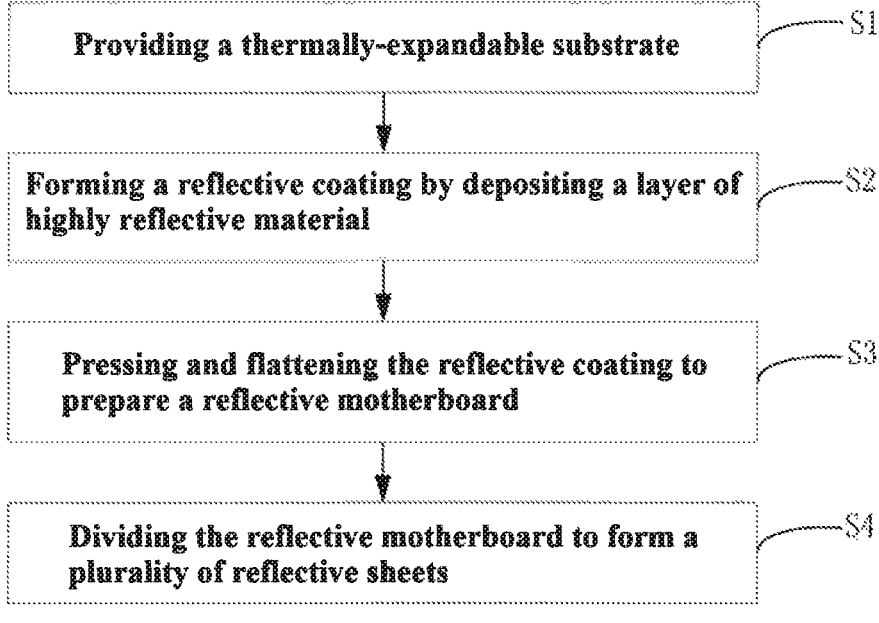
FIG. 9 is a schematic flow chart of a reflection sheet according to the present disclosure.

With respect to FIGS. 8 and 9, a method for preparing a reflection sheet 10 provided by embodiments of the present disclosure comprises steps of:

S1: providing a thermally-expandable substrate 101;

S2: forming a reflective coating 102 by depositing a layer of highly reflective material;

S3: pressing and flattening the reflective coating 102 to prepare a reflective motherboard;

S4: dividing the reflective motherboard to form a plurality of reflection sheets 10.

wherein, the highly reflective material may be titanium dioxide.

After the reflection sheet 10 is prepared, it is possible to dig holes in a part of areas of the reflection sheet 10, and it is also possible to cover the release film 60 with a film, thereby protecting the reflection sheet 10.

In an embodiment, the step of preparing a reflective coating 102 by depositing a layer of highly reflective material further comprises preparing a reflective coating 102 by depositing a layer of highly reflective material by magnetron sputtering.

Among them, the magnetron sputtering method is more compact and more uniform than the reflective coating 102 prepared by mechanical pressing.

It can be understood that magnetron sputtering is used to deposit the highly reflective materials on the substrate more evenly and tightly, which prevents the reflection sheet 10 from expanding, and prevents relative displacement between the reflective coating 102 and the thermally-expandable substrate 101, thus avoiding the reflective coating 102 from falling off.

In this embodiment, the process of preparing the reflective coating 102 is limited to magnetron sputtering, so that bonding forces between the reflective coating 102 and the thermally-expandable substrate 101 is improved, the reflective coating 102 is more uniformly and tightly disposed, and the problem that the reflective coating 102 falls off due to the thermal expansion of the reflection sheet 10 is avoided.

In an embodiment, the step of dividing the reflective motherboard further comprises dividing the reflective motherboard by means of mechanical cutting.

Here, heat generated by the mechanical cutting can be further reduced by selecting or limiting the cutting rate, moving rate, materials, etc. of the mechanical cutting to prevent the thermally-expandable substrate 101 from being deformed or displaced by heat.

It can be understood that since the thermal expansion substrate 101 expands when heated, mechanical cutting is less likely to cause large deformation or displacement of the thermally-expandable substrate 101 compared to laser cutting, so that production yield can be improved.

In this embodiment, the cutting mode is defined as mechanical cutting with low heat generation, which further improves the yield.

The light-emitting panel provided in embodiments of the present disclosure comprises a substrate, a light-emitting device, and a reflection sheet, wherein the light-emitting device and the reflection sheet are disposed on the same side of the substrate. The reflection sheet comprises a first through-hole disposed in one-to-one correspondence with the light-emitting device, and the reflection sheet at an edge of the first through-hole is configured to wrap around an edge of the light-emitting device, and a gap between an edge of the first through-hole and an edge adjacent to the light-emitting device is less than 0.1 mm, so that a distance between the edge of the first through hole and the edge of the light-emitting device is reduced, and the size and width of the windowed area are reduced, thereby alleviating the technical problem of non-uniform light efficiency at edges of the light-emitting device in the existing light-emitting panel.

In the above embodiments, description of each embodiment has its own emphasis. For parts not detailed in one embodiment, please refer to related description of other embodiments.

The reflection sheet and the preparation method thereof, and the light-emitting panel and the preparation method thereof provided in embodiments of the present disclosure are described in detail above, and the principles and embodiments of the present disclosure are described by using specific examples herein. Descriptions of the above embodiments are merely intended to help understand the method and core ideas of the present disclosure. Meanwhile, for a person skilled in the art, there will be changes in both the specific embodiments and application scope in accordance with the teachings of the present disclosure. In view of the foregoing, contents of this specification should not be construed as a limitation on the present disclosure.

What is claimed is:

1. A light-emitting panel, comprising:
   a substrate;
   a plurality of light-emitting devices directly disposed on a first surface of the substrate;
   a driving device directly disposed on the first surface of the substrate; and
   a reflection sheet covering the substrate and the driving device;
   wherein the reflection sheet comprises a plurality of first through-holes, which are in one-to-one correspondence with the plurality of light-emitting devices, and the reflection sheet at an edge of the plurality of first through-holes is configured to wrap around an edge of the plurality of light-emitting devices, and a gap between an edge of the plurality of first through-holes and an edge adjacent to the plurality of light-emitting devices is less than 0.1 mm.

2. The light-emitting panel according to claim 1, wherein the reflection sheet comprises a thermally-expandable substrate and a reflective coating disposed on one side of the thermally-expandable substrate, the plurality of first through-holes penetrate through the thermally-expandable substrate and the reflective coating, and wherein a material for preparing the thermally-expandable substrate has a coefficient of thermal expansion of greater than or equal to 60 ppm/° C.

3. The light-emitting panel according to claim 2, wherein the material for preparing the thermally-expandable substrate comprises at least one of a polyoxymethylene resin and polydimethylsiloxane.

4. The light-emitting panel according to claim 2, wherein an absolute value of a difference of thermal expansion coefficients between the reflective coating and the thermally-expandable substrate is less than or equal to 50 ppm/° C.

5. The light-emitting panel according to claim 1, wherein shapes of the plurality of first through-hole are the same as those of the plurality of light-emitting devices, and sizes of the plurality of first through-holes are larger than or equal to those of the plurality of light-emitting devices.

6. The light-emitting panel according to claim 1, wherein the driving device is a driving chip or a resistor.

7. The light-emitting panel according to claim 3, wherein both the coefficient of thermal expansion of the polyoxymethylene resin and the coefficient of thermal expansion of the polydimethylsiloxane are higher than that of a PET material.

8. The light-emitting panel according to claim 2, wherein a material for preparing the reflective coating comprises at least an organic expandable material.

9. The light-emitting panel according to claim 2, wherein a material for preparing the reflective coating further comprises titanium dioxide.

10. The light-emitting panel according to claim 1, wherein the substrate is provided with at least one vacuum hole penetrating through the substrate.

11. The light-emitting panel according to claim 1, wherein a height of each of the plurality of light-emitting devices is greater than a height of the reflection sheet.

\* \* \* \* \*